(12) United States Patent
Wang et al.

(10) Patent No.: US 8,890,181 B2
(45) Date of Patent: Nov. 18, 2014

(54) DISPLAY PANEL AND DISPLAY DEVICE

(71) Applicant: AU Optronics Corporation, Hsin-Chu (TW)

(72) Inventors: Po-Kai Wang, Hsin-Chu (TW); Chun-Hao Huang, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 0 days.

(21) Appl. No.: 13/917,769

(22) Filed: Jun. 14, 2013

(65) Prior Publication Data
US 2014/0197428 A1 Jul. 17, 2014

(30) Foreign Application Priority Data
Jan. 11, 2013 (TW) .............................. 102101168 A (51) Int. Cl.
*H01L 33/08* (2010.01)
*G07F 17/32* (2006.01)

(52) U.S. Cl.
CPC ...................................... *G07F 17/32* (2013.01)
USPC ........................................................... 257/88

(58) Field of Classification Search
CPC .................................................... H01L 33/387
See application file for complete search history.

(56) References Cited

U.S. PATENT DOCUMENTS

| 7,110,064 B2 * | 9/2006 | Kameda .......................... 349/96 |
| 8,070,117 B2 | 12/2011 | Burge |
| 2011/0285925 A1 | 11/2011 | Ono et al. |

FOREIGN PATENT DOCUMENTS

TW 531018 5/2003

* cited by examiner

*Primary Examiner* — Stephen W Smoot
(74) *Attorney, Agent, or Firm* — WPAT, PC; Justin King (57) ABSTRACT

A display panel includes an array substrate, an opposite substrate, and at least one closed sealing element. The array substrate has a first through hole, and the array substrate includes a plurality of pixel units, a plurality of scan lines, and a plurality of data lines. The scan lines are electrically connected to the pixel units. The data lines intersect with the scan lines, and the data lines are electrically connected to the corresponding pixel units. The opposite substrate is disposed opposite to the array substrate, and the opposite substrate has a second through hole. The closed sealing element is disposed between the array substrate and the opposite substrate, and the closed sealing element has a third through hole. The first through hole, the second through hole, and the third through hole form an opening.

18 Claims, 12 Drawing Sheets

DISPLAY PANEL AND DISPLAY DEVICE

RELATED APPLICATIONS

This application claims priority to Taiwan Application Serial Number 102101168, filed Jan. 11, 2013, which is herein incorporated by reference.

BACKGROUND

1. Technical Field

The present disclosure relates to a display panel.

2. Description of Related Art

As the display panel industry gradually matures, display panels are being applied in great number to various products to provide a variety of types of display images. However, when combined with a display device, the display panel may need to be designed in a specific shape depending on the particular outer appearance of the display device, such as when the display panel is applied to a game machine.

In greater detail, a display area of the display panel is used for providing display images. The display area includes a plurality of pixel units, and image signals can be transmitted to each pixel unit through intersecting scan lines and data lines to show the display images. Therefore, one important area of development is that related to combining the display panel and other apparatus for use in application to a game machine.

SUMMARY

A display panel includes an array substrate, an opposite substrate, and at least one closed sealing element. The array substrate has a first through hole, and the array substrate includes a plurality of pixel units, a plurality of scan lines, and a plurality of data lines. The scan lines are electrically connected to the pixel units. The data lines intersect with the scan lines, and the data lines are electrically connected to the corresponding pixel units. The opposite substrate is disposed opposite to the array substrate, and the opposite substrate has a second through hole. The closed sealing element is disposed between the array substrate and the opposite substrate, and the closed sealing element has a third through hole. The first through hole, the second through hole, and the third through hole form an opening.

In one or more embodiments, the array substrate further has a wiring area, and the scan lines and the data lines in the wiring area are disposed around the first through hole.

In one or more embodiments, a width of the wiring area is about 20 mm.

In one or more embodiments, the array substrate further includes at least one light-shielding layer. A vertical projection of the wiring area on the opposite substrate substantially overlaps the light-shielding layer, and a vertical projection of the closed sealing element on the opposite substrate overlaps at least one portion of the light-shielding layer.

In one or more embodiments, a width of the light-shielding layer is about 20 mm. The second through hole and the light-shielding layer form a square, and a length of the square is about 120 mm.

In one or more embodiments, the opposite substrate includes a plurality of color filters. Vertical projections of the color filters on the array substrate substantially overlap the pixel units, respectively.

In one or more embodiments, the numbers of the first through holes, the second through holes, and the third through holes are all plural.

In one or more embodiments, the first through hole is a square, and a length of the square is about 80 mm; the second through hole is a square, and a length of the square is about 80 mm; and the third through hole is a square, and a length of the square is about 100 mm.

In one or more embodiments, the pixel units are in a display area of the array substrate. The display panel further comprises a sealant disposed between the array substrate and the opposite substrate. The sealant surrounds a sealant area, and a vertical projection of the sealant area on the array substrate substantially overlaps the display area.

In one or more embodiments, the display panel further includes a display medium disposed between the array substrate and the opposite substrate.

A display device includes a display panel and a display apparatus. The display panel includes an array substrate, an opposite substrate, and at least one closed sealing element. The array substrate has a first through hole, and the array substrate includes a plurality of pixel units, a plurality of scan lines, and a plurality of data lines. The scan lines are electrically connected to the pixel units. The data lines intersect with the scan lines, and the data lines are electrically connected to the corresponding pixel units. The opposite substrate is disposed opposite to the array substrate, and the opposite substrate has a second through hole. The closed sealing element is disposed between the array substrate and the opposite substrate, and the closed sealing element has a third through hole. The first through hole, the second through hole, and the third through hole form an opening. The display apparatus includes at least one display element, and at least one portion of the display element is exposed through the opening.

In one or more embodiments, the display element is a roller.

A display device includes a display panel and a display apparatus. The display panel has a first display area and a second display area. The display apparatus disposed opposite to the display panel includes at least one display element. The at least one display element is exposed by the second display area, and the at least one display element does not overlap the first display area.

In one or more embodiments, the display panel includes an array substrate, an opposite substrate, and at least one closed sealing element. The array substrate includes a plurality of pixel units, a plurality of scan lines, and a plurality of data lines. The scan lines are electrically connected to the pixel units. The data lines intersect with the scan lines, and the data lines are electrically connected to the corresponding pixel units. The opposite substrate is disposed opposite to the array substrate. The closed sealing element is disposed between the array substrate and the opposite substrate, and defining the second display area therein.

In one or more embodiments, the display panel further includes a display medium disposed between the array substrate and the opposite substrate.

In one or more embodiments, the array substrate has a first through hole formed therein, and the opposite substrate has a second through hole formed therein. The first through hole and the second through hole are all in the second display area, and a vertical projection of the first through hole on the opposite substrate overlaps at least one portion of the second through hole.

In one or more embodiments, the display apparatus further includes a rotation apparatus for driving the roller.

In one or more embodiments, the display panel is a liquid crystal display panel, an electroluminescence display panel, an electrowetting display panel, or an electrophoresis display panel.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
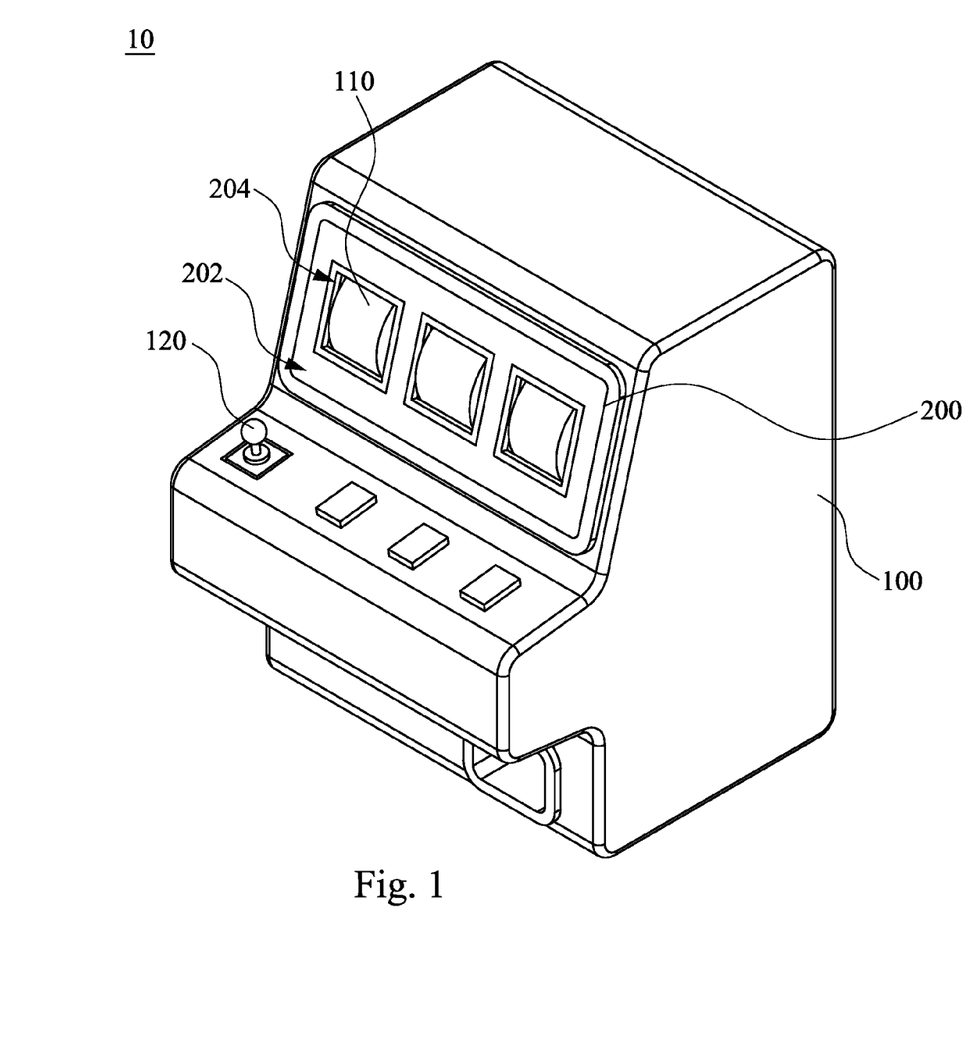
FIG. 1 is a schematic view of a display device according to one embodiment of the present invention.
Figure 2:
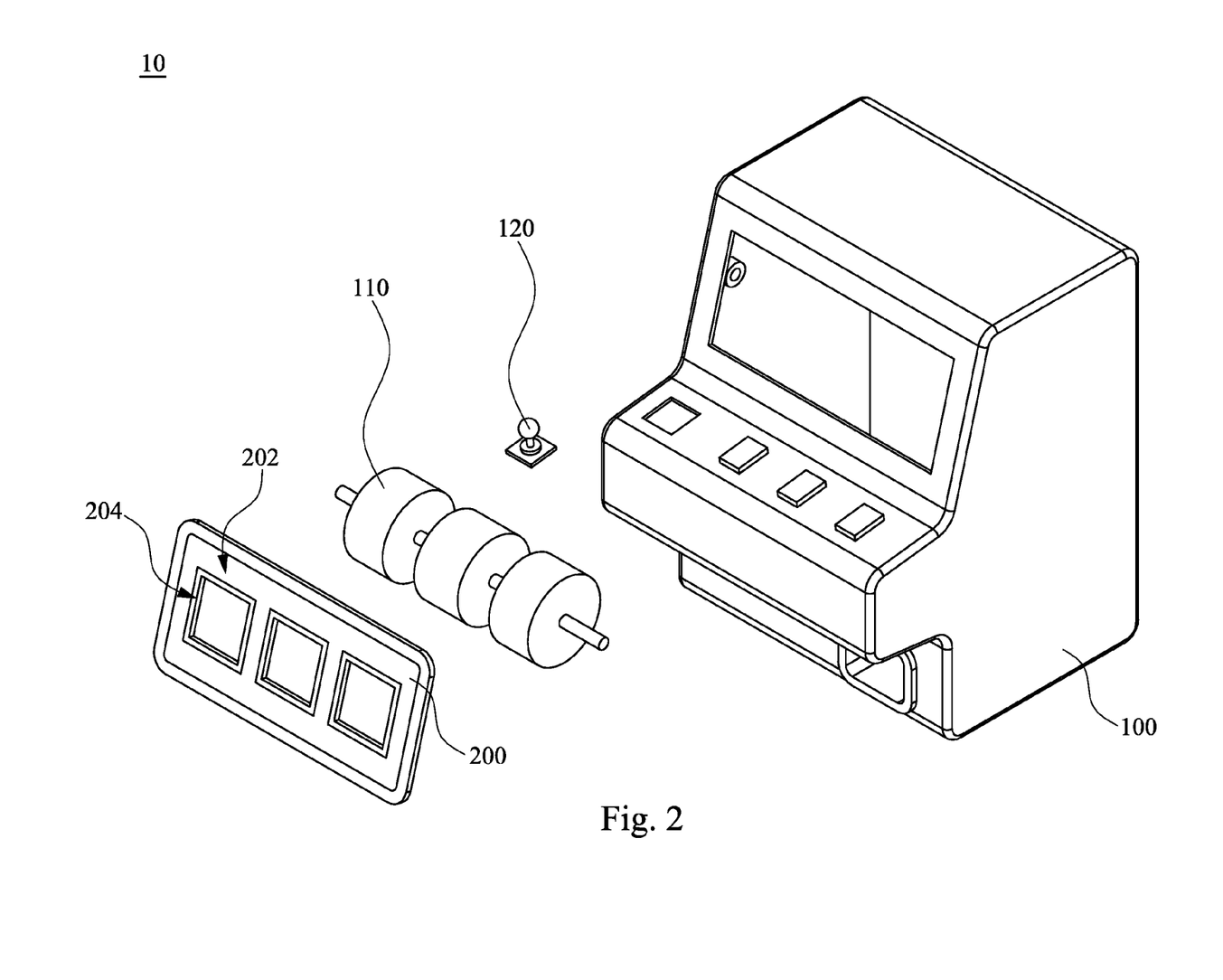
FIG. 2 is an exploded perspective view of the display device of FIG. 1.

FIG. 1 is a schematic view of a display device 10 according to one embodiment of the present invention. FIG. 2 is an exploded perspective view of the display device 10 of FIG. 1. The display device 10 includes a display apparatus 100 and a display panel 200. The display panel 200 has a first display area 202 and a second display area 204. In this embodiment, the number of the second display area 204 is three for example, and the first display area 202 and the second display areas 204 may not overlap. For convenience in the following, the second display area 204 is described as a singular element, but a plurality of the same may be provided. The display apparatus 100 is disposed in a particular positional relationship relative to the display panel 200. For example, the display apparatus 100 is behind or beneath the display panel 200. In other design, the display panel 200 may be embedded in the display apparatus 100. The display apparatus 100 includes at least one display element 110, which has pictures provided thereon. The display element 110 is exposed by the second display area 204, and the display element 110 and the first display area 202 may not overlap. Therefore, the first display area 202 can display images and the second display area 204 can display pictures provided by the display element 110. The first display area 202 is not affected by the presence of the second display area 204. For example, the first display area 202 and the second display area 204 may individually and respectively display images and pictures, as described above.

The display device 10 may be a game machine. In this embodiment, the display device 10 is shown by way of example as being a slot machine, and the display element 110 may be a roller. The outer surface of the roller has different pictures provided thereon, which may display in the second display area 204 of the display panel 200 through rotating the roller. The roller and the first display area 202 may not overlap. In this embodiment, the display panel 200 may have an opening corresponding to the second display area 204, and a portion of the roller may be exposed through the opening to show the pictures provided thereon. Through such a configuration, tangibility of the roller may be provided, resulting in increasing intimacy with the user using the display device 10. In one or more other embodiments, the display panel 200 may include a transparent glass or a transparent plastic material corresponding to the second display area 204, rather than an opening, such that the user can still see the roller but the roller is not directly exposed. However, the scope of claimed invention is not limited with respect to the formation of the second display area 204. The first display area 202 of the display panel 200 may show different images according to game results, such as game mission completed or game over, and during a standby period, to increase the interaction between the display device 10 and the user. The display device 10 may further include an operating apparatus, such as a joystick, for activating the roller. Therefore, the pictures on the outer wall of the roller can be shown sequentially in the second display area 204. It should be understood that the slot machine is only illustrative, and should not limit the scope of the claimed invention. A person having ordinary skill in the art may design the type of the display device 10 according to actual requirements.

The display device 200 may be a liquid crystal display panel, an electroluminescence display panel, an electrowetting display panel, or an electrophoresis display panel. As described above, the number of the second display area 204 of the display panel 200 is not limited to one, i.e., the display panel 200 may include a plurality of the second display areas 204. For example, in the case where the display device 10 is a slot machine, three of the second display areas 204 may be provided for respectively exposing three rollers. However, the scope of claimed invention is not limited with respect to these features of the display device 200.

Figure 3:
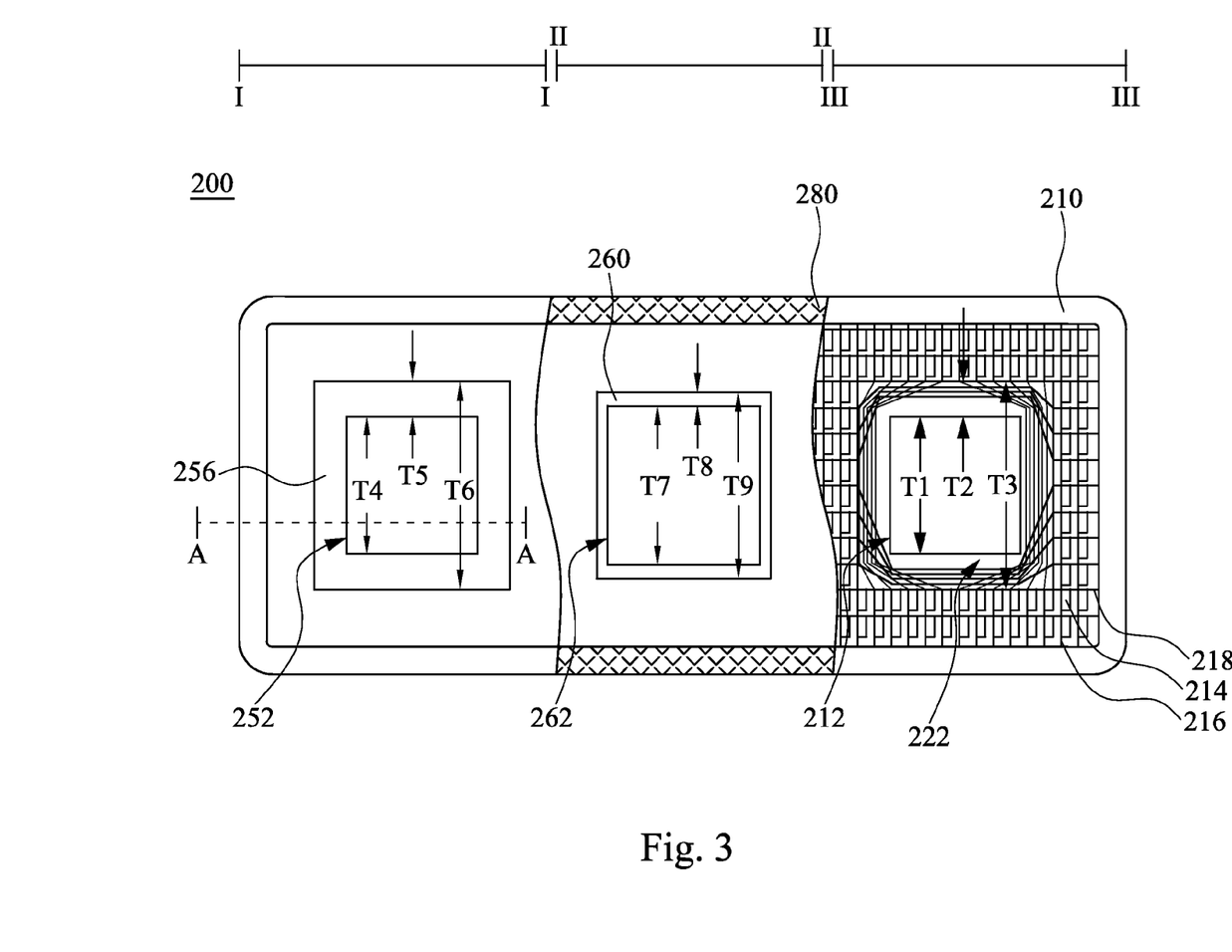
FIG. 3 is a top view of a display panel of FIG. 1.
Figure 4:
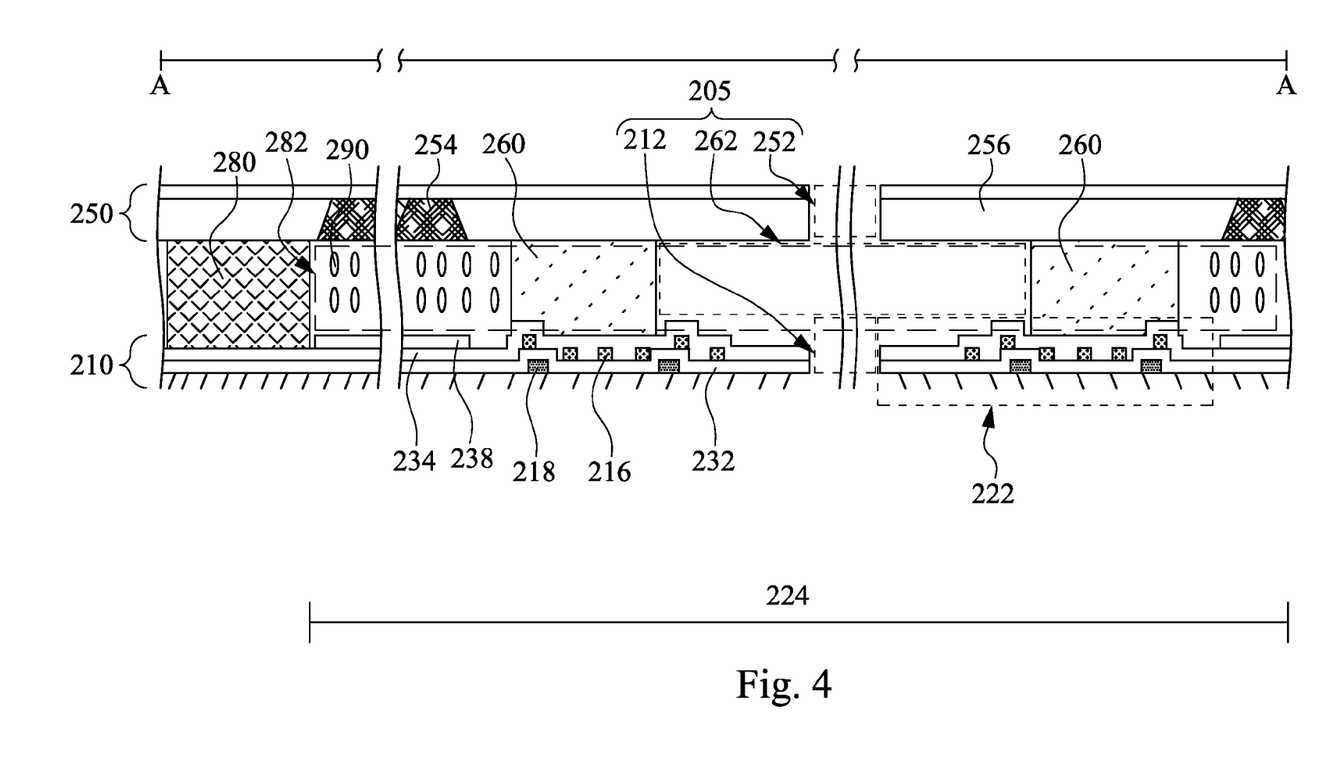
FIG. 4 is a cross-sectional view along line A-A of FIG. 3 according to one embodiment.

FIG. 3 is a top view of the display panel 200 of FIG. 1. FIG. 4 is a cross-sectional view along line A-A of FIG. 3 according to one embodiment. The display panel 200 of FIG. 3 is divided into three areas and some of elements may not be shown in each area for clearly showing the inner elements of the display panel 200. In particular, there is no element removed in area I-I, the opposite substrate 250 appearing in FIG. 4 is removed in area II-II, and only the array substrate 210 is shown in area III-III. The display panel 200 includes the array substrate 210, the opposite substrate 250, and three closed sealing elements 260. The array substrate 210 has a first through hole 212 and includes a plurality of pixel units 214, a plurality of data lines 216, and a plurality of scan lines 218. The scan lines 218 are electrically connected to corresponding pixel units 214. The data lines 216 intersect with the scan lines 218, and the data lines 216 are also electrically connected to corresponding pixel units 214. In particular, as shown in FIG. 4, each of the pixel units 214 in FIG. 3 comprises a thin-film transistor (TFT) (not shown) and a pixel electrode 238. A gate electrode of the thin-film transistor is electrically connected to the corresponding scan line 218, a source electrode of the thin-film transistor is electrically connected to the corresponding data line 216, and a dielectric layer 232 is disposed between the gate electrode and the source electrode to isolate these elements from each other. In addition, a passivation layer 234 is disposed between a drain electrode of the thin-film transistor and the pixel electrode 238. The passivation layer 234 may have a via hole (not shown), such that the pixel electrode 238 can be electrically connected to the drain electrode through the via hole.

Particular reference is made to FIG. 4. The opposite substrate 250 is disposed opposite to the array substrate 210, and the opposite substrate 250 has a second through hole 252. The closed sealing element 260 has a third through hole 262 and is disposed between the array substrate 210 and the opposite substrate 250. The first through hole 212, the second through hole 252, and the third through hole 262 form an opening 205. The opening 205 corresponds to the second display area 204 of FIG. 1. An area where the pixel units 214 in FIG. 3 are located corresponds to the first display area 202 of FIG. 1. It should be understood that although a vertical projection of the second through hole 252 on the array substrate 210 substantially overlaps the first through hole 212, such a configuration should not limit the scope of the claimed invention. Different configurations fall within the scope of the present invention in other embodiments, as long as the first through hole 212, the second through hole 252, and the third through hole 262 can form an opening 205, such that the display element 110 of FIG. 1 can be exposed through the opening 205, i.e., vertical projections of the second through hole 252 and the third through hole 262 on the array substrate 210 may overlap only a portion of the first through hole 212.

Figure 5A:
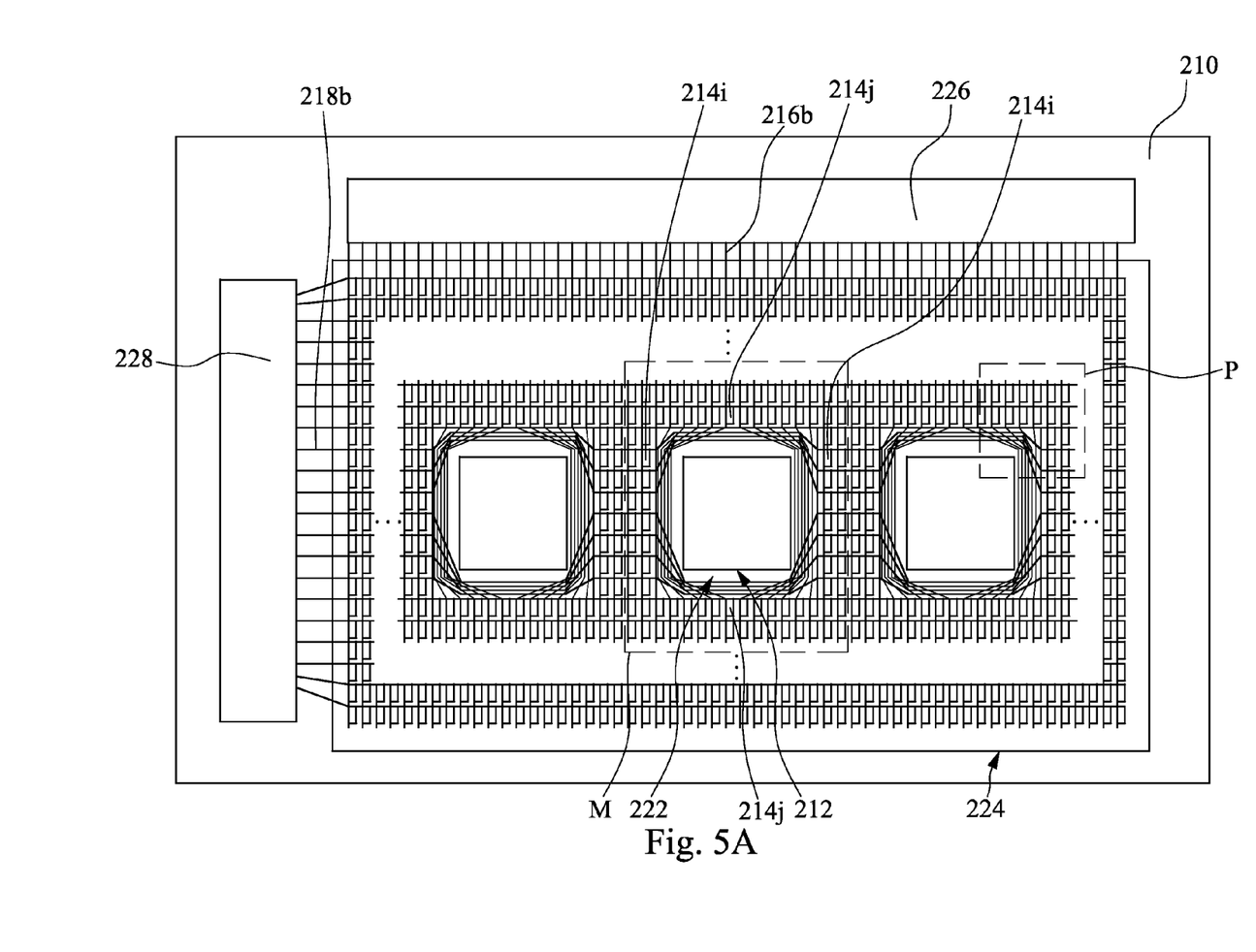
FIG. 5A is a top view of an array substrate of FIG. 3.

FIG. 5A is a top view of the array substrate 210 of FIG. 3. The array substrate 210 can further include a wiring area 222, a source driving element 226, and a gate driving element 228 to enable the smooth transmission of image signals to all of the pixel units 214$i$ and 214$j$. The wiring area 222 is between the first through hole 212 and the pixel units 214 adjacent to the first through hole 212. The source driving element 226 and the gate driving element 228 are disposed on two sides of the display area 224, and are connected to the data lines 216 and the scan lines 218, respectively. Therefore, the image signals can be transmitted to the pixel units 214$i$ and 214$j$ from the source driving element 226 and the gate driving element 228 through the data lines 216 and the scan lines 218 which are connected respectively to the source driving element 226 and the gate driving element 228. The wiring area 222 is disposed in the display area 224, and surrounds the edges of the first through hole 212, and the pixel units 214$i$ and 214$j$ are not disposed in the wiring area 222.

Figure 5B:
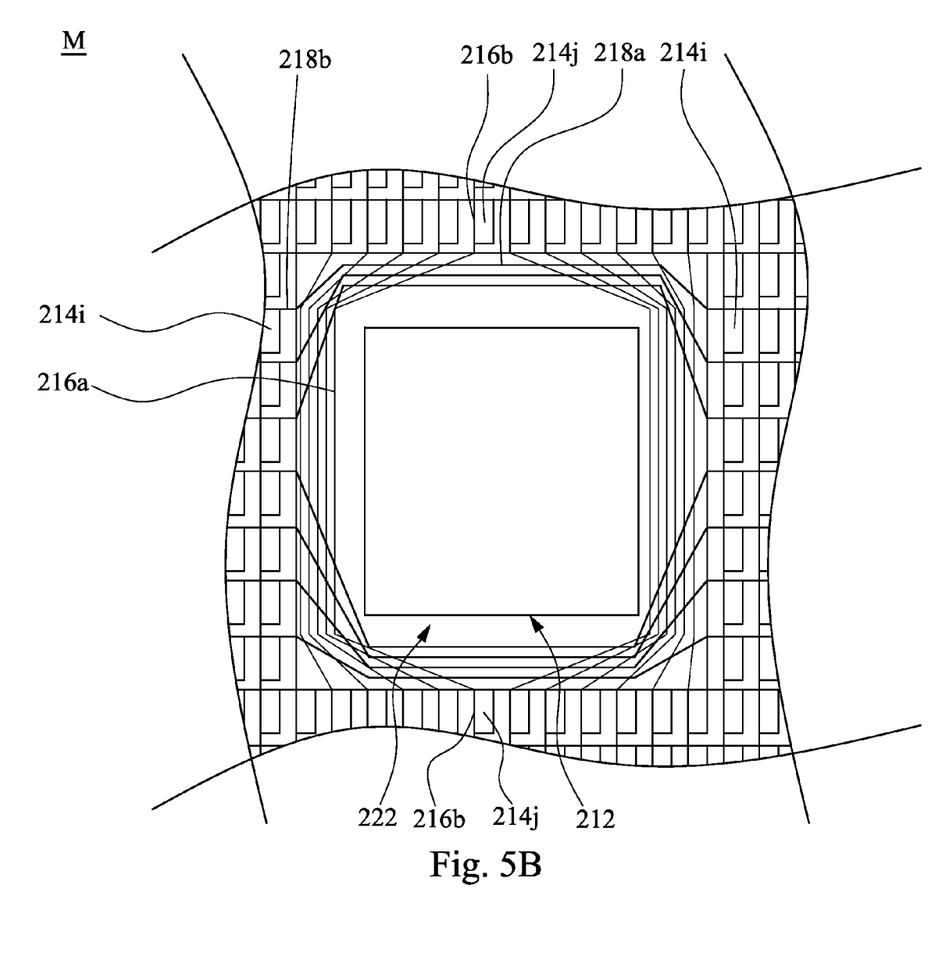
FIG. 5B is an enlarged view of area M of FIG. 5A.

FIG. 5B is an enlarged view of area M of FIG. 5A. It should be noticed that in the following descriptions, a portion of each data line 216 located in the wiring area 222 is defined as a data line portion 216$a$, and another portion of each data line 216 located outside the wiring area 222 is defined as a data line portion 216$b$. Similarly, a portion of each scan line 218 located in the wiring area 222 is defined as a scan line portion 218$a$, and another portion of the scan line 218 located outside the wiring area 222 is defined as a scan line portion 218$b$.

The data lines portions 216$a$ are disposed around the first through hole 212, and are connected to the pixel units 214$j$ which are disposed on two opposite sides of the first through hole 212, respectively. Therefore, the pixel units 214$j$ can be connected with the data lines 216 to receive the image signals. Moreover, the scan lines portion 218$a$ are disposed around the first through hole 212, and are electrically connected to the pixel units 214$i$ which are disposed on two opposite sides of the first through hole 212, respectively. Therefore, the pixel units 214$i$ can be connected with the scan lines 218 to receive the image signals. Hence, the display panel 200 having the opening 205 in FIG. 4 can display normally through the configuration mentioned above.

Continued reference is made to FIG. 5B. Since the presence of the wiring area 222 may cause a reduction in the aperture ratio of the display area 224 of the array substrate 210 as shown in FIG. 5A, the configuration of the data line portions 216$a$ and scan line portions 218$a$ in the wiring area 222 may be adjusted to reduce the area of the wiring area 222 in the display area 224. In one or more embodiments, the data line portions 216$a$ and the scan line portions 218$a$ can be disposed around the first through hole 212 substantially in a concentrated or clustered configuration. In particular, the scan line portions 218$b$ individually enter the wiring area 222 from the pixel units 214$i$ disposed adjacent to one side of the first through hole 212 (left side of the first through hole 212 for example). The scan line portions 218$a$ are close to each other in the wiring area 222, surround the edges of the first through hole 212 in a clustered configuration, and then spread out to form scan line portions 218$b$ outside the wiring area 222 to individually connect to the pixel units 214$i$ disposed on the opposite side of the first through hole 212 (right side of the first through hole 212 for example). Similarly, the data line portions 216$b$ individually enter the wiring area 222 from the pixel units 214$j$ disposed adjacent to first side of the first through hole 212. The data line portions 216$a$ are close to each other in the wiring area 222, surround the edges of the first through hole 212 in clustered configuration, and then spread out to form data line portions 216$b$ outside the wiring area 222 to individually connect to the pixel units 214$j$ disposed adjacent to the second side which is opposite to the first side of the first through hole 212. The configuration mentioned above can effectively reduce the width of the wiring area 222.

Figure 6:
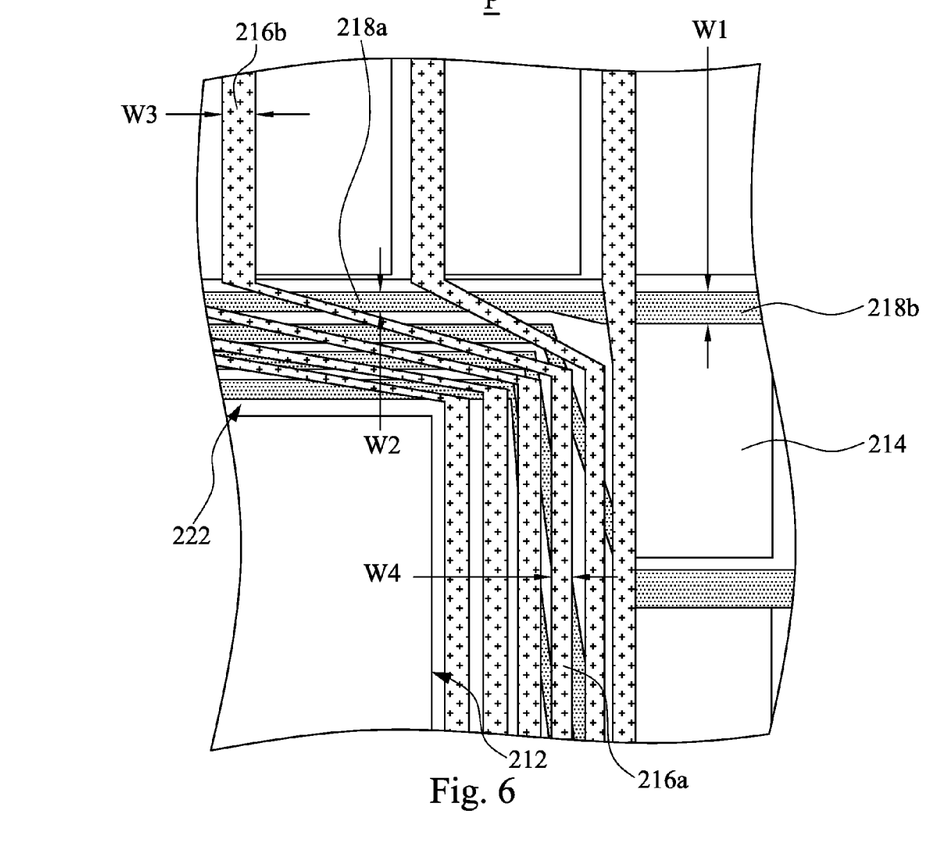
FIG. 6 is an enlarged view of area P of FIG. 5A.

FIG. 6 is an enlarged view of area P of FIG. 5A. The widths of the data line portions 216$a$ and the scan line portions 218$a$ can be smaller than the widths of the data line portions 216$b$ and scan line portions 218$b$ to further reduce the width of the wiring area 222. In greater detail, the scan line portions 218$b$ have a width W1, while the scan line portions 218$a$ have a width W2, in which W1>W2. Similarly, the data line portions 216$b$ have a width W3, while the data line portions 216$a$ have a width W4, in which W3>W4. Therefore, the wiring area 222 can be reduced since not only are the data line portions 216$a$ and the scan line portions 218$a$ disposed in a clustered configuration, as described above, but the data line portions 216$a$ and the scan line portions 218$a$ have smaller widths than that of the data line portions 216$b$ and the scan line portions 218$b$.

The source driving element 226 in FIG. 5A may be a source driving chip, and the gate driving element 228 may be a gate driving circuit with Gate Driver on Array (GOA) technology or a gate driving chip. However, the use of such circuitry or chips for these elements should not limit the scope of the claimed invention.

Reference is made back to FIG. 4. The display panel 200 may further include a sealant 280 (indicated in FIG. 3) and a display medium 290. The display medium 290 is used for changing the physical properties of lights displayed by the display panel 200, and the sealant 280 is used for sealing the display medium 290 into a space between the array substrate 210 and the opposite substrate 250. In particular, the sealant 280 is disposed between the array substrate 210 and opposite substrate 250 to define a sealant area 282 therein. A vertical projection of the sealant area 282 on the array substrate 210 substantially overlaps the display area 224. The display medium 290 is disposed between the array substrate 210 and the opposite substrate 250, and in the sealant area 282. In addition, the closed sealing element 260 can prevent the display medium 290 from leaking out of the opening 205. A vertical projection of the closed sealing element 260 can overlap at least one portion of the wiring area 222, and may even overlap the entire wiring area 222, such that the aperture ratio of the display panel 200 is not affected by the closed sealing element 260. The type of the display medium 290 can be different according to the type of the display panel 200. For example, the display medium 290 is liquid crystal material when the display panel 200 is a liquid crystal display panel, the display medium 290 is polarity or non-polarity liquid when the display panel 200 is an electrowetting display panel, and the display medium 290 are microcapsules when the display panel 200 is an electrophoresis display panel.

The opposite substrate 250 can further include at least one light-shielding layer 256. A vertical projection of the wiring area 222 on the opposite substrate 250 substantially overlaps the light-shielding layer 256, and a vertical projection of the closed sealing element 260 on the opposite substrate 250 also overlaps at least one portion of the light-shielding layer 256. The light-shielding layer 256 can prevent the light of the display panel 200 from leaking out through the wiring area 222 or the closed sealing element 260, such that the quality of the display area 200 can be improved.

In one or more embodiments, the opposite substrate 250 includes a plurality of color filters 254. A vertical projection of each color filter 254 on the array substrate 210 substantially overlaps one of the pixel units, which is substantially the area that the pixel electrode 238 of the array substrate 210 covers, for filtering the light passing through the array substrate 210 of the display panel 200 (indicated in FIG. 3) to obtain light of a certain color (red, green or blue, for example). However, the arrangement mentioned above should not limit the scope of claimed invention.

Figure 7:
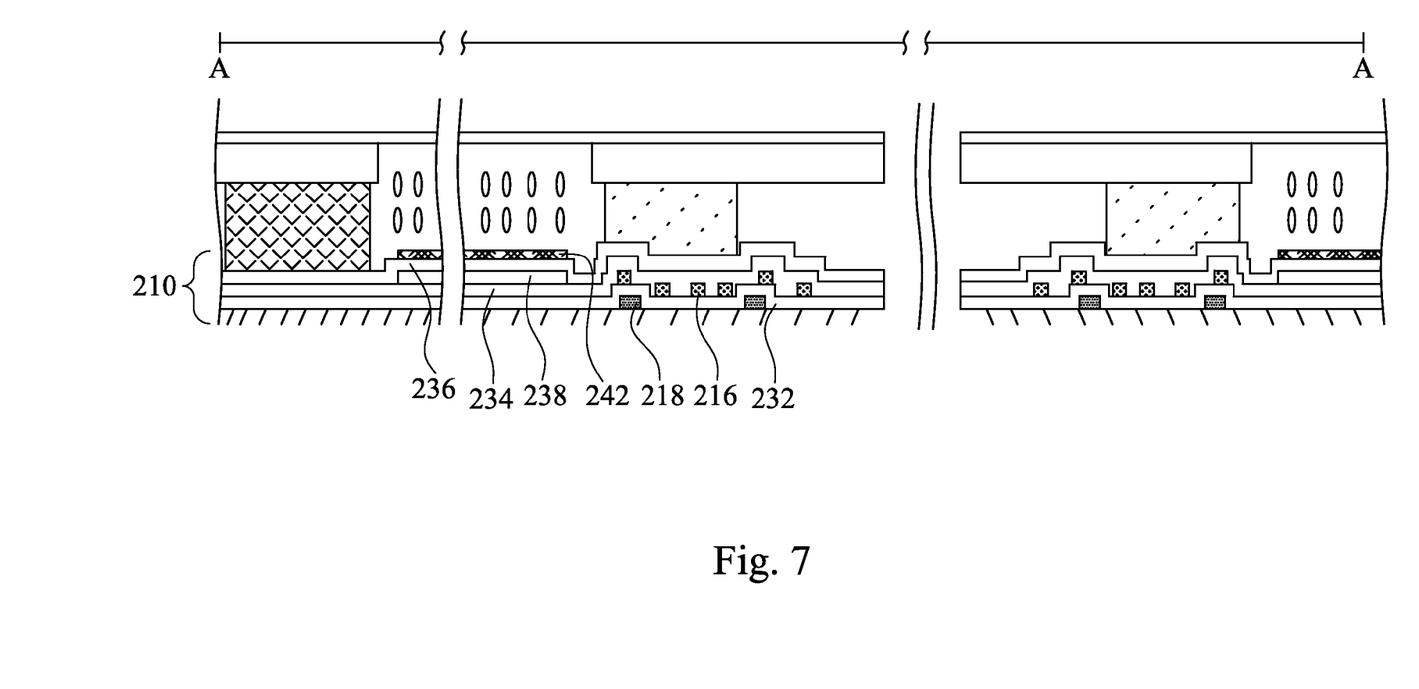
FIG. 7 is a cross-sectional view along line A-A of FIG. 3 according to another embodiment.

FIG. 7 is a cross-sectional view along line A-A of FIG. 3 according to another embodiment. In this embodiment, the array substrate 210 further includes color filters 242 individually stacked with pixel units (substantially in the area that the pixel electrodes 238 of the array substrate 210 covers), and the stack technique used at this time is a Color Filter on Array (COA) technique. With the Color Filter on Array technique, the aperture ratio of the pixel units 214 as marked in FIG. 3 can be raised, and the brightness of the display panel 200 (indicated in FIG. 3) can be also enhanced. A dielectric layer 232 is disposed between the data lines 216 and the scan lines 218 to isolate these elements from each other. Each pixel unit 214 comprises a thin-film transistor (TFT) (not shown) and a pixel electrode 238. A gate electrode of the thin-film transistor is electrically connected to one of the scan lines 218, and a source electrode of the thin-film transistor is electrically connected to one of the data lines 216. The dielectric layer 232 is also disposed between the gate electrode and the source electrode. In addition, a passivation layer 234 is disposed between a drain electrode of the thin-film transistor and the pixel electrode 238, and has a via hole (not shown), such that the pixel electrode 238 can be electrically connected to the drain electrode through the via hole. After fabricating the elements mentioned above, the manufacturer can fabricate the color filters 242 on each pixel electrode 238, where another passivation layer 236 can be disposed between the color filters 242 and the pixel electrodes 238 to protect the circuit on the array substrate 210.

Reference is made back to FIG. 3. The numbers of the first through hole 212, the second through hole 252, and the third through hole 262 can be plural. For example, the numbers of these elements are all three in this embodiment. In this embodiment, the first through hole 212 may be in a square shape, and a length T1 of the square is about 80 mm. The width T2 of the wiring area 222 is about 20 mm, and the first through hole 212 and the wiring area 222 also form a square having length T3 of about 120 mm. The second through hole 252 may be in a square shape, and a length T4 of the square is about 80 mm. The width T5 of the light-shielding layer 256 is about 20 mm, and the second through hole 252 and the light-shielding layer 256 also form a square having length T6 of about 120 mm. The third through hole 262 may be in a square shape, and a length T7 of the square is about 100 mm. The width T8 of the closed sealing element is about 1 mm, and the third through hole 252 and the closed sealing element 260 also form a square having length T9 of about 102 mm. It should be understood that the square shapes, the lengths, and the widths of these elements are only illustrative, and should not limit the scope of claimed invention. A person having ordinary skill in the art may design the shapes, the lengths, and the widths of the first through hole 212, the second through hole 252, the third through hole 262, the wiring area 222, the light-shielding layer 256, and the closed sealing element 260 according to actual requirements.

It is noted that in the following paragraphs, the structural details of the array substrate 210 described above will not be repeated hereinafter, and only further information of the following embodiments is supplied. In one or more embodiments, the configuration of the data lines 216 and the scan lines 218 of the array substrate 210 is not limited to the configuration in FIG. 5A.

Figure 8:
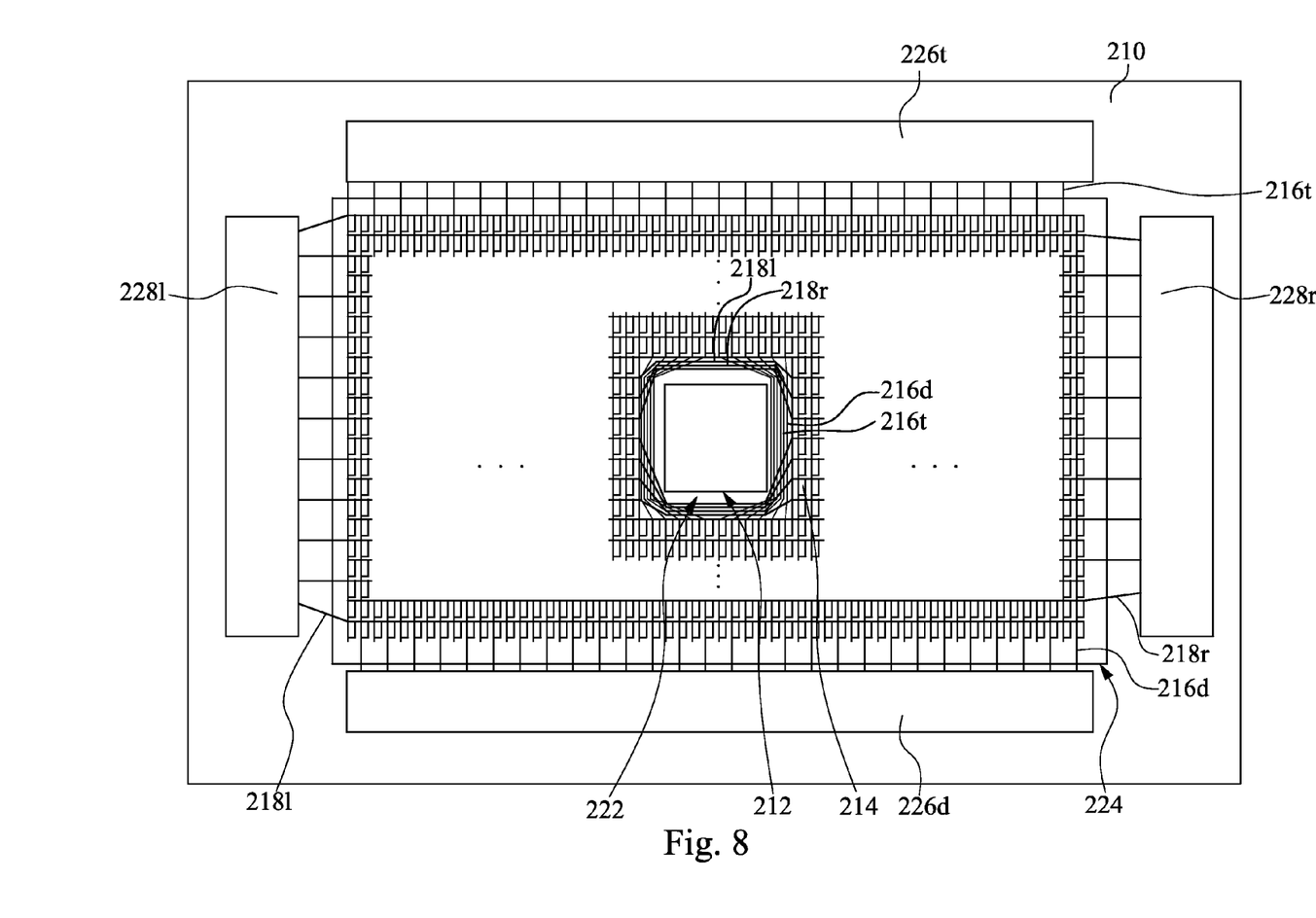
FIG. 8 is a top view of the array substrate according to another embodiment of the present invention.

FIG. 8 is a top view of the array substrate 210 according to another embodiment of the present invention. In this embodiment, the number of the first through hole 212 is one. However, it can be plural. Please refer to FIG. 4 and FIG. 8. The array substrate 210 includes a pair of source driving elements 226t and 226d, and a pair of gate driving elements 228l and 228r. The pair of the source driving elements 226t and 226d are disposed on two opposite sides outside the display area 224, respectively. The data line portions 216t are electrically connected to the source driving element 226t. The data line portions 216d are electrically connected to the source driving element 226d. The data line portions 216t and data line portions 216d are arranged alternately. In other words, two adjacent data lines 216 are respectively and electrically connected to the source driving elements 226t and 226d. On the other hand, the pair of the gate driving elements 228l and 228r are disposed on other opposite sides outside the display area 224, respectively. The scan line portions 218l are electrically connected to the gate driving elements 228l. The scan line portions 218r are electrically connected to the gate driving element 228r. The scan line portions 218r and scan line portions 218l are arranged alternately. In other words, two adjacent scan lines 218 are respectively and electrically connected to the gate driving elements 228l and 228r. The data line portions 216t and 216d and the scan line portions 218l and 218r in the wiring area 222 are electrically connected to the pixel units 214 disposed adjacent to two opposite sides of the first through hole 212, and are disposed around the first through hole 212 in clustered configuration. Other features of the array substrate 210 are the same as those of the array substrate 210 shown in FIG. 5A, and therefore, a description in this regard will not be provided hereinafter.

Figure 9:
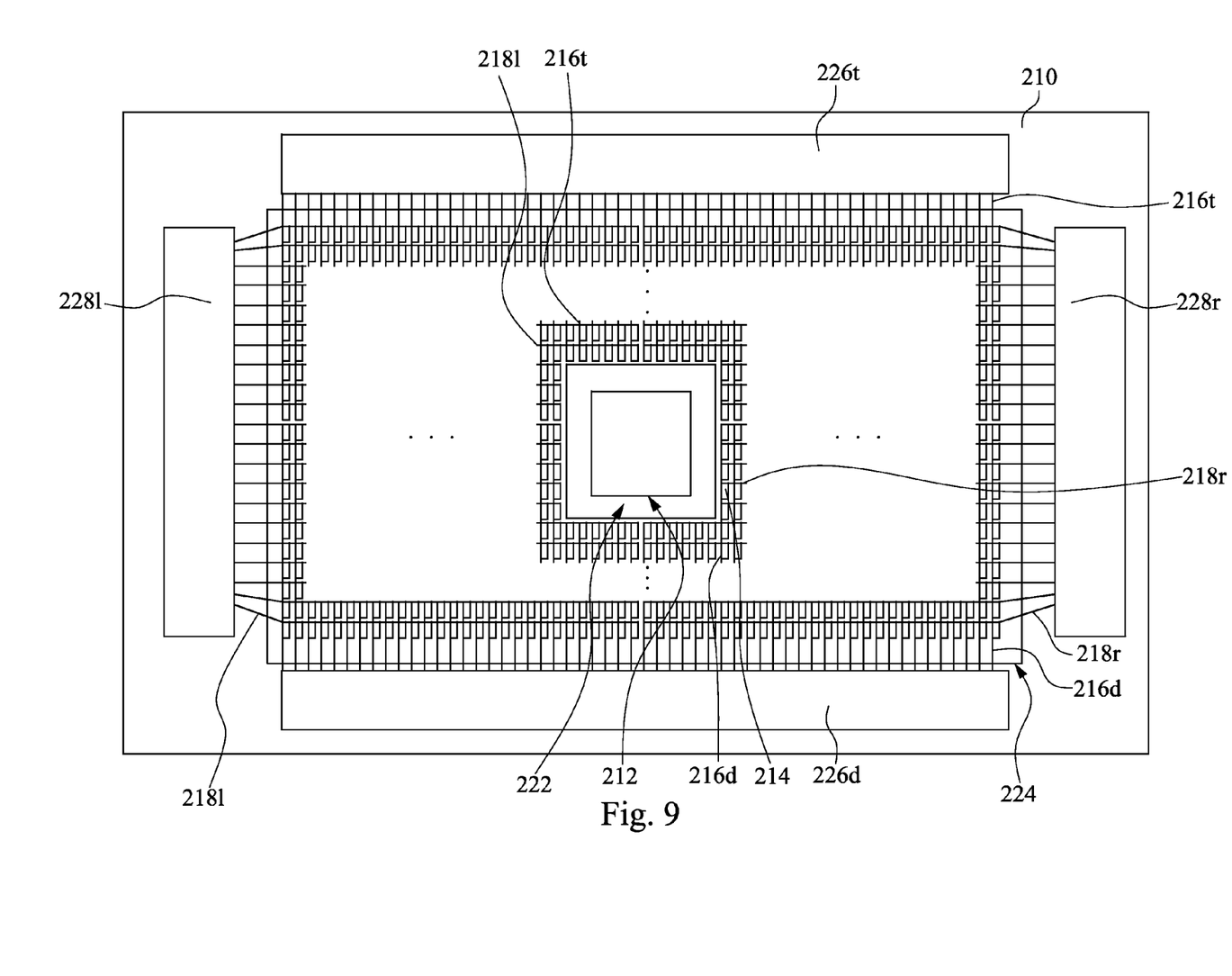
FIG. 9 is a top view of the array substrate according to yet another embodiment of the present invention.

FIG. 9 is a top view of the array substrate 210 according to yet another embodiment of the present invention. In this embodiment, the number of the first through hole 212 is one. However, it can be plural. The array substrate 210 includes a pair of source driving elements 226t and 226d, and a pair of gate driving elements 228l and 228r. The pair of the source driving elements 226t and 226d are disposed on two opposite sides outside the display area 224, respectively. The data line portions 216t and 216d are electrically connected to the source driving elements 226t and 226d, respectively, without crossing or surrounding the first through hole 212. On the other hand, the pair of the gate driving elements 228l and 228r are disposed on the other two opposite sides outside the display area 224, respectively. The scan line portions 218l and 218r are electrically connected to the gate driving elements 228l and 228r, respectively, without crossing or surrounding the first through hole 212. Therefore, there is no need to further layout wiring formed in the wiring area 222 (a vertical projection area of the closed sealing element 260 in FIG. 4 on the array substrate 210), such that the wiring area 222 can be further reduced. Other features of the array substrate 210 are the same as those of the array substrate 210 shown in FIG. 5A, and therefore, a description in this regard will not be provided hereinafter.

Figure 10:
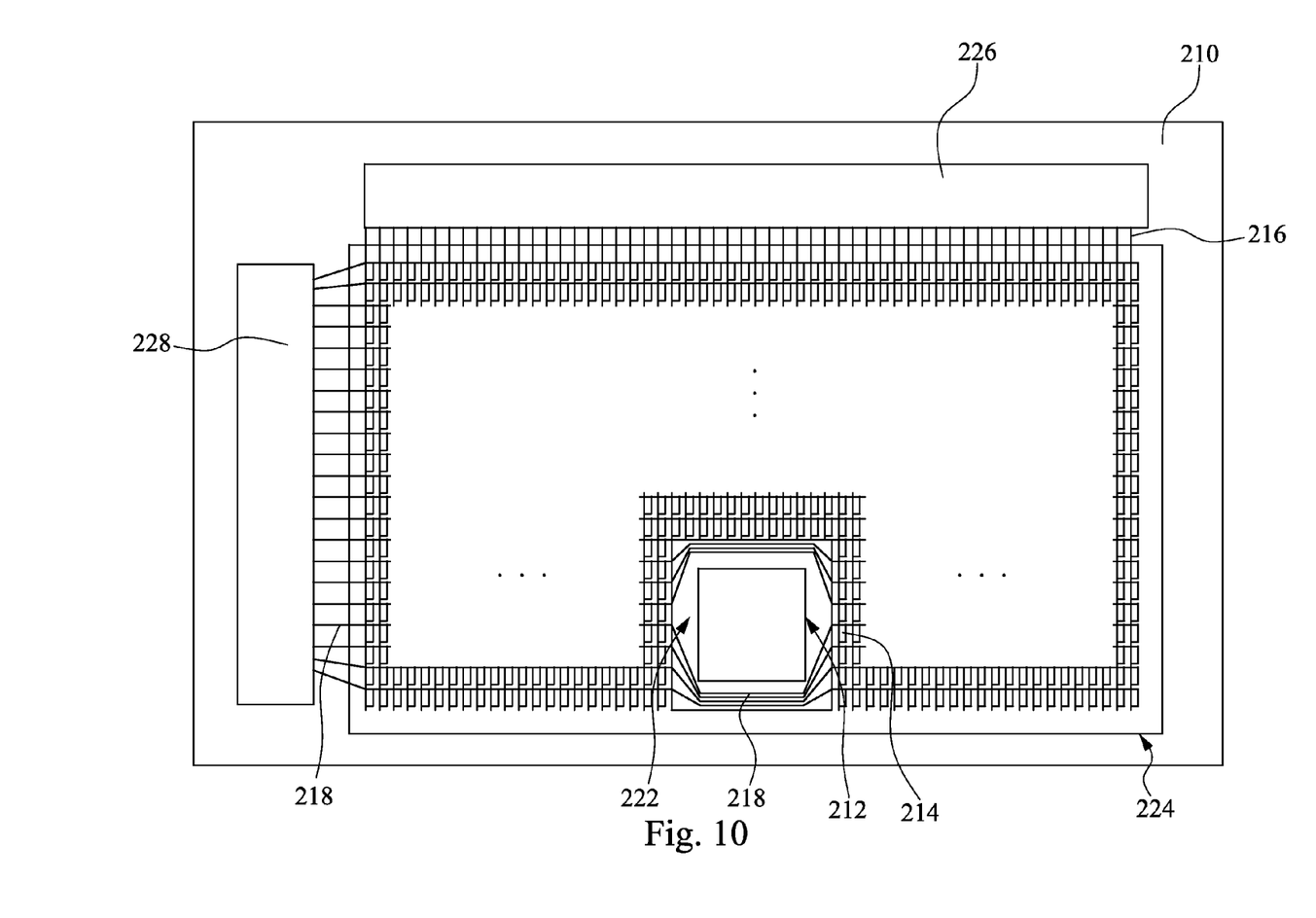
FIG. 10 is a top view of the array substrate according to yet another embodiment of the present invention.

FIG. 10 is a top view of the array substrate 210 according to yet another embodiment of the present invention. In this embodiment, the number of the first through hole 212 is one. However, it can be plural. Only the first side (the bottom side) of the first through hole 212 is not adjacent to the pixel units 214. The other three sides of the first through hole 212 are adjacent to the pixel units 214. However, the scope of the claimed invention should not be limited in this respect. The array substrate 210 includes a source driving element 226 and a gate driving element 228. There are no pixel units 214 located between the first side (the bottom side) of the first through hole 212 and the bottom edge of the display area 224. Therefore, the wiring area 222 does not need to include a corresponding layout, such as the data lines 216 in this embodiment. In particular, in this embodiment, since the two sides of the first through hole 212 parallel to each data line 216 are adjacent to the pixel units 214, scan line portion(s) of at least one of the scan lines 218 needs to be provided in the wiring area 222 to connect the pixel units 214 adjacent to the two sides. However, the data lines 216 can be directly connected to the source driving element 226 without passing through the wiring area 222. Other features of the array substrate 210 are the same as those of the array substrate 210 shown in FIG. 5A, and therefore, a description in this regard will not be provided hereinafter.

Figure 11:
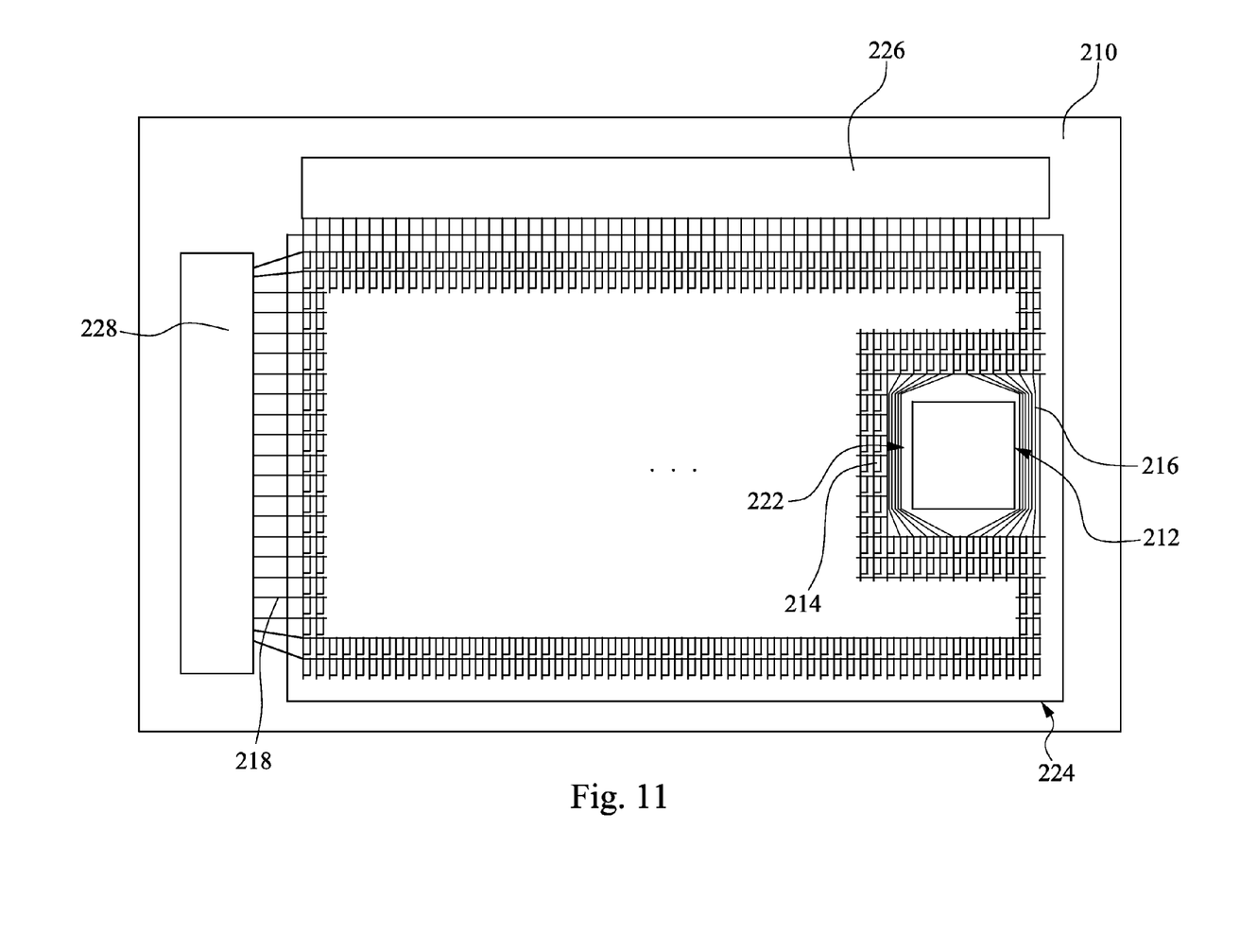
FIG. 11 is a top view of the array substrate according to yet another embodiment of the present invention.

FIG. 11 is a top view of the array substrate 210 according to yet another embodiment of the present invention. In this embodiment, the number of the first through hole 212 is one. However, it can be plural. Only one side (the right side, for example) of the first through hole 212 is not adjacent to the pixel units 214. However, the scope of the claimed invention should not be limited in this respect. The array substrate 210 includes a source driving element 226 and a gate driving element 228. There are no pixel units 214 between the right side of the first through hole 212 and the right edge of the display area 224. Therefore, the wiring area 222 does not need to include a corresponding layout, such as the scan lines 218 in this embodiment. In particular, in this embodiment, since the two sides of the first through hole 212 parallel to each scan line 218 are adjacent to the pixel units 214, the data line portion(s) of at least one of the data lines 216 needs to be provided in the wiring area 222 to connect the pixel units 214 adjacent to the two sides. However, the scan lines 218 can be directly connected to the gate driving element 228 without passing through the wiring area 222. Other features of the array substrate 210 are the same as those of the array substrate 210 shown in FIG. 5A, and therefore, a description in this regard will not be provided hereinafter.

It should be understood that although the configurations of the data line portions 216a, 216b, 216t, and 216d and the scan line portions 218a, 218b, 218l, and 218r in FIG. 5A, FIG. 8, and FIG. 9 are the same, the configurations of the data lines 216 and the scan lines 218 can be different according to actual requirements. The scope of the claimed invention should not be limited in this respect, and it is necessary only that the data lines 216 and the scan lines 218 of the array substrate 210 can be connected to the source driving element 226 and the gate driving element 228, respectively.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A display panel, comprising:
   an array substrate having a first through hole, comprising:
      a plurality of pixel units;
      a plurality of scan lines electrically connected to the pixel units; and
      a plurality of data lines intersecting with the scan lines, and electrically connected to the corresponding pixel units;
   an opposite substrate disposed opposite to the array substrate and having a second through hole; and
   at least one closed sealing element disposed between the array substrate and the opposite substrate, and having a third through hole, wherein the first through hole, the second through hole, and the third through hole form an opening.

2. The display panel of claim 1, wherein the array substrate further has a wiring area, and the scan lines and the data lines in the wiring area are disposed around the first through hole.

3. The display panel of claim 2, wherein a width of the wiring area is about 20 mm.

4. The display panel of claim 2, wherein the array substrate further comprises:
   at least one light-shielding layer, a vertical projection of the wiring area on the opposite substrate substantially overlapping the light-shielding layer, and a vertical projection of the closed sealing element on the opposite substrate overlapping at least one portion of the light-shielding layer.

5. The display panel of claim 4, wherein a width of the light-shielding layer is about 20 mm, the second through hole and the light-shielding layer form a square, and a length of the square is about 120 mm.

6. The display panel of claim 1, wherein the opposite substrate comprises a plurality of color filters, and vertical projections of the color filters on the array substrate substantially overlap the pixel units, respectively.

7. The display panel of claim 1, wherein the numbers of the first through holes, the second through holes, and the third through holes are all plural.

8. The display panel of claim 1, wherein the first through hole is a square, and a length of the square is about 80 mm; the second through hole is a square, and a length of the square is about 80 mm; and the third through hole is a square, and a length of the square is about 100 mm.

9. The display panel of claim 1, wherein the pixel units are in a display area of the array substrate, the display panel further comprises a sealant disposed between the array substrate and the opposite substrate, the sealant surrounds a sealant area, and a vertical projection of the sealant area on the array substrate substantially overlaps the display area.

10. The display panel of claim 1, further comprising a display medium disposed between the array substrate and the opposite substrate.

11. A display device, comprising:
   a display panel, comprising:
      an array substrate having a first through hole comprising:
         a plurality of pixel units;
         a plurality of scan lines electrically connected to the pixel units; and a plurality of data lines intersecting with the scan lines, and electrically connected to the corresponding pixel units;

an opposite substrate disposed opposite to the array substrate and having a second through hole; and at least one closed sealing element disposed between the array substrate and the opposite substrate, and having a third through hole, wherein the first through hole, the second through hole, and the third through hole form an opening; and a display apparatus comprising at least one display element, wherein at least one portion of the display element is exposed through the opening.

12. The display device of claim 11, wherein the display element is a roller.

13. A display device comprising:

a display panel having a first display area and a second display area, wherein the display panel comprises:

an array substrate comprising:

a plurality of pixel units;

a plurality of scan lines electrically connected to the pixel units; and a plurality of data lines intersecting with the scan lines, and electrically connected to the corresponding pixel units;

an opposite substrate disposed opposite to the array substrate; and at least one closed sealing element disposed between the array substrate and the opposite substrate, and defining the second display area therein; and a display apparatus comprising at least one display element, wherein the at least one display element is exposed by the second display area, and the at least one display element does not overlap the first display area.

14. The display device of claim 13, wherein the display panel further comprises a display medium disposed between the array substrate and the opposite substrate.

15. The display device of claim 13, wherein the array substrate has a first through hole, the opposite substrate has a second through hole, the first through hole and the second through hole are in the second display area, and a vertical projection of the first through hole on the opposite substrate overlaps at least one portion of the second through hole.

16. The display device of claim 13, wherein the display element is a roller.

17. The display device of claim 16, wherein the display apparatus further comprises:

a rotation apparatus for driving the roller.

18. The display device of claim 13, wherein the display panel is a liquid crystal display panel, an electroluminescence display panel, an electrowetting display panel, or an electrophoresis display panel.

* * * * *